United States Patent [19]
Voorman et al.

[11] Patent Number: 5,909,024
[45] Date of Patent: Jun. 1, 1999

[54] INTEGRATED SYSTEM FOR READING MAGNETIC INFORMATION

[75] Inventors: Johannes Voorman, Geldrop, Netherlands; Patrick Leclerc; Fabrice Punch, both of Caen, France

[73] Assignee: U.S. Philips Corporation, New York, N.Y.

[21] Appl. No.: 08/996,674

[22] Filed: Dec. 23, 1997

[30] Foreign Application Priority Data

Dec. 31, 1996 [FR] France .................................. 96 16260

[51] Int. Cl.⁶ ................................ G06K 7/08; G06K 7/00
[52] U.S. Cl. ....................... 235/449; 235/440; 235/439; 235/493; 235/475
[58] Field of Search .................................... 235/449, 440, 235/439, 493, 475

[56] References Cited

U.S. PATENT DOCUMENTS

| | | | |
|---|---|---|---|
| 4,849,616 | 7/1989 | Mizote | 235/449 |
| 5,266,786 | 11/1993 | Mazumder | 235/449 |
| 5,612,528 | 3/1997 | Green et al. | 235/449 |
| 5,822,159 | 10/1998 | Fukuyama et al. | 360/113 |

OTHER PUBLICATIONS

"Preparing the Pre–Amplifier for the Brave New World of MR Heads" Published in Data Storage in Apr. 1996, Peter Jung, VTC, Inc. pp. 23–30.

Primary Examiner—Anita Pellman Gross
Assistant Examiner—Daniel St. Cyr
Attorney, Agent, or Firm—Steven S. Rubin

[57] ABSTRACT

The invention relates to a system for reading magnetic information, comprising a magnetoresistive bar and a first differential amplifier connected to the magnetoresistive bar. A reading system according to the invention also comprises a second differential amplifier arranged in parallel with the first amplifier, a first capacitor arranged between the first transistor and the magnetoresistive bar, and a second capacitor arranged between the fourth transistor and the bar, and an analog adder combining the output signals of the first and second amplifiers. This structure allows integration of the decoupling capacitors and thus prevents the occurrence of external resistances and inductances which are detrimental to the common-mode reject rate.

6 Claims, 4 Drawing Sheets

INTEGRATED SYSTEM FOR READING MAGNETIC INFORMATION

BACKGROUND OF THE INVENTION

The invention relates to a system for reading magnetic information, comprising:

a read head provided with a magnetoresistive bar whose electric resistivity varies when it is subjected to a magnetic field variation, said bar having a first and a second terminal and being intended to be traversed by a bias current of a predetermined value, a first amplifier comprising a first and a second transistor arranged as a differential pair, with their bases connected to the first and the second terminal, respectively, of the magnetoresistive bar and at least one collector constituting an output of the first amplifier.

Such a reading system is described in the article "Preparing the preamplifier for the brave new world of MR heads", published in DATA STORAGE in April 1996. In this reading system, a coupling capacitor ensures, within the amplifier, a decoupling of the DC component of the signal which is present at the terminals of the magnetoresistive bar. This coupling capacitor is arranged between the emitters of the first and second transistors. The first amplifier has a passband which is limited by a low cut-off frequency and a high cut-off frequency, which passband must be as large as possible. Here, the low cut-off frequency is, in a first approximation, of the order of the inverse value of the product between the value of the coupling capacitor and the value of the resistance, viewed from the emitters of the transistors. As this resistance typically has a value of the order of about ten Ohms, a considerable value is to be given to the coupling capacitor for obtaining an acceptable value of the low cut-off frequency. If it is desired to obtain a low cut-off frequency FO of the order of megahertz values, the coupling capacitor must have a value of the order of about ten nanofarad, which is very difficult to realize in an integrated form. The use of an external capacitor induces the creation of parasitic inductances and resistances which are difficult to control and are detrimental to the satisfactory operation of the system, particularly at high frequencies, and also disturb the symmetry of the amplifier, which degrades its common-mode reject rate.

It is possible to replace the coupling capacitor mentioned above by two capacitors, referred to as decoupling capacitors, each arranged between the base of one of the transistors and one of the terminals of the magnetoresistive bar. In such an amplifier, the low cut-off frequency will be, in a first approximation, of the order of the inverse value of the product between the equivalent value of the two series-arranged decoupling capacitors and the base resistances of the transistors. As such a resistance is of the order of a hundred times larger than the resistance viewed from the emitters, the value of the decoupling capacitors used in such an amplifier may be, for the same low cut-off frequency FO of the order of megahertz values, of the order of a hundred times smaller than that of the coupling capacitor present in the known reading system. This leads to a value of the order of about a hundred picofarad, which remains difficult to realize in an integrated form.

SUMMARY OF THE INVENTION

It is an object of the invention to remedy this drawback by providing a reading system whose architecture allows a considerable reduction of the value of the decoupling capacitors without having to increase the value of the low cut-off frequency.

According to the invention, a system for reading magnetic information as described in the opening paragraph is characterized in that the system also comprises:

a second amplifier comprising a third and a fourth transistor arranged as a differential pair, with their bases connected to the first and the second terminal, respectively, of the magnetoresistive bar and at least one collector constituting an output of the second amplifier, a first and a second capacitor having equal nominal values, the first capacitor being arranged between the base of the first transistor and the first terminal of the magnetoresistive bar, the second capacitor being arranged between the base of the fourth transistor and the second terminal of the magnetoresistive bar, and an analog adder having a first input connected to the output of the first amplifier, a second input connected to the output of the second amplifier and an output intended to supply a signal which is representative of the sum of the values of the signals received at the first and second inputs.

The fact that the first and second capacitors each act on a single input of one of the amplifiers, as well as the splitting of the impedance obtained by arranging the first and second amplifiers in parallel allows a reduction of the value of the first and second capacitors with respect to the value of the decoupling capacitors described above. It will hereinafter be demonstrated that the reduction factor is minimally of the order of four with respect to the value of the decoupling capacitors mentioned above. The value of the first and second capacitors is then several tens of picofarads, which can be realized in an integrated form.

The splitting of the amplification function by means of the first and second amplifiers induces the necessity of combining the outputs of these amplifiers, which function is realized by means of the analog adder. Numerous embodiments of this adder are possible. One embodiment of the invention provides a system for reading magnetic information as described above, which is characterized in that the analog adder comprises:

a first and a second module of the transconductance type, each having an input constituting one of the inputs of the adder and an output intended to supply a current which is proportional to the value of a voltage received at its input, and a resistor having one terminal connected to a fixed voltage terminal and another terminal connected to the outputs of the first and second transconductance modules, the voltage at the terminals of said resistor constituting the output signal of the analog adder.

In a particular embodiment of the invention, each transconductance module is constituted by a pair of transistors whose emitters are connected to a current source via resistors, whose bases constitute a symmetrical input of the transconductance module, the collector of one of the transistors constituting the output of the transconductance module.

In the majority of applications for which such a reading system is intended, the bases of the transistors which constitute the first and the second amplifiers must be subjected to a DC bias voltage. This voltage must be independent of the variations of the AC voltages to which said bases are subjected.

A preferred embodiment of the invention thus provides a system for reading magnetic information as described above, which is characterized in that each amplifier comprises an element having an inductive behavior and connected between the bases of the transistors in the amplifier, said inductive element comprising:

- a pair of transistors, referred to as primary pair, whose emitters are connected to a current source, whose bases are connected to the collectors of the transistors of the amplifier, and whose collectors are interconnected via a capacitor, and
- another pair of transistors whose emitters are connected to a current source, whose bases are connected to the collectors of the transistors of the primary pair, and whose collectors are connected to the bases of the transistors of the amplifier.

The inductive behavior of the elements arranged between the bases of the transistors of each amplifier allows a fixed bias voltage to be attributed to said bases, which voltage is independent of variations of the AC voltage to which the bases are subjected.

These and other aspects of the invention are apparent from and will be elucidated with reference to the embodiments described hereinafter.

DETAILED DESCRIPTION OF THE PREFERRED EMBODIMENT

Figure 1:
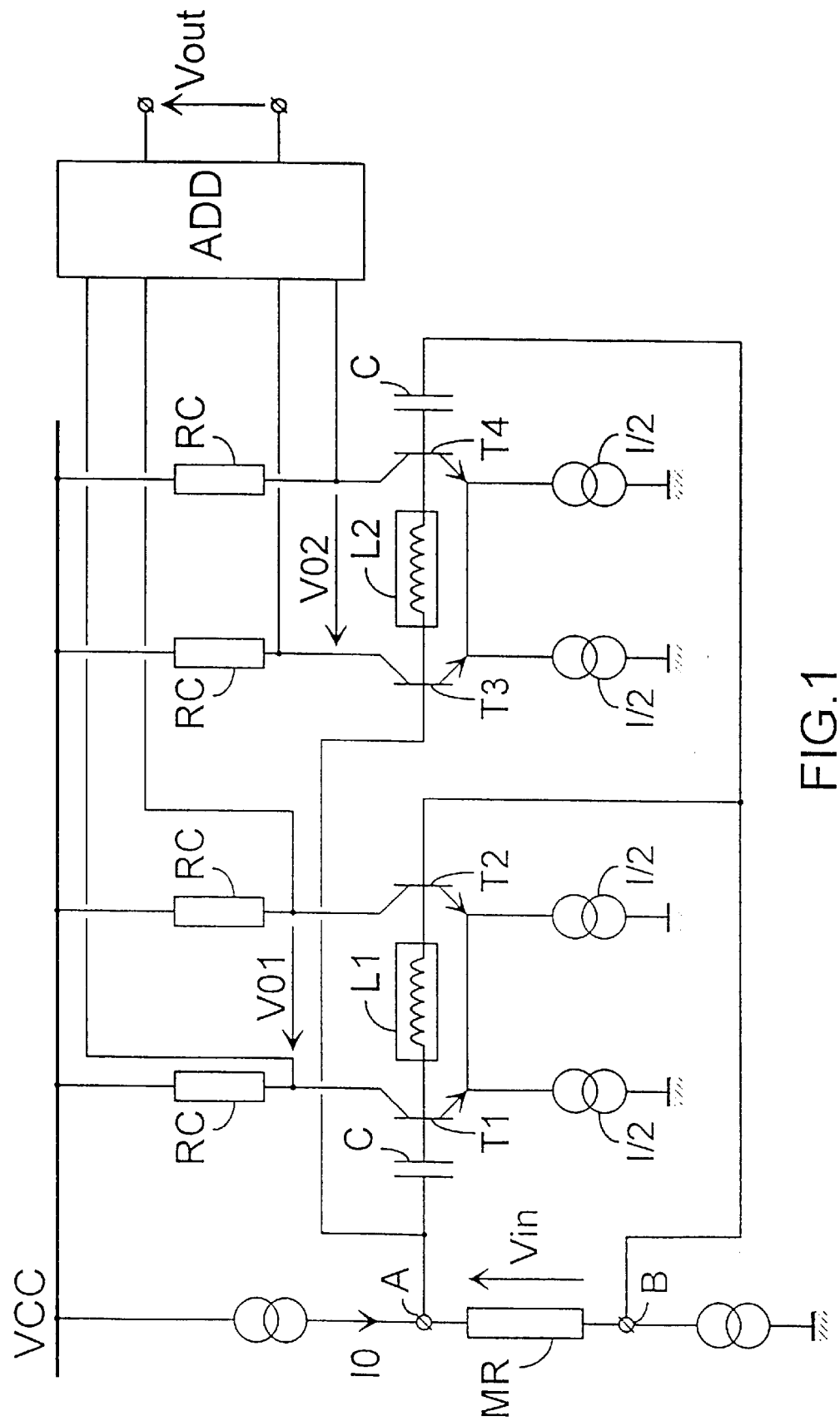
FIG. 1 is a diagram showing a system for reading magnetic information according to the invention.

FIG. 1 shows partially a system for reading magnetic information according to the invention, which system comprises:

- a read head provided with a magnetoresistive bar MR whose electric resistivity varies when it is subjected to a variation of the magnetic field, said bar having a first terminal A and a second terminal B and being intended to be traversed by a bias current IO of a predetermined value,
- a first amplifier comprising a first transistor T1 and a second transistor T2 arranged as a differential pair, whose bases are connected to the first and second terminals A and B of the magnetoresistive bar MR and whose collectors constitute a symmetrical output of the first amplifier, supplying a voltage V01.

This reading system also comprises:

- a second amplifier comprising a third transistor T3 and a fourth transistor T4 arranged as a differential pair, whose bases are connected to the first and second terminals A and B of the magnetoresistive bar MR and whose collectors constitute a symmetrical output of the second amplifier, supplying a voltage V02,
- a first and a second capacitor having nominal values which are equal to C, the first capacitor being inserted between the base of the first transistor T1 and the first terminal A of the magnetoresistive bar MR, the second capacitor being inserted between the base of the fourth transistor T4 and the second terminal of the magnetoresistive bar MR, and
- an analog adder ADD having a first symmetrical input connected to the symmetrical output of the first amplifier, a second symmetrical input connected to the symmetrical output of the second amplifier, and an output intended to supply a signal Vout which is representative of the sum of the values of the signals V01 and V02 received at the first and second inputs.

The bases of the transistors which constitute the first and second amplifiers, T1, T2 and T3, T4 are interconnected by means of elements having an inductive behavior, L1 and L2, respectively. This ensures that the bases of these transistors are subjected to a bias voltage which is independent of the variations of the alternating voltages to which these bases are subjected.

Figure 2A:
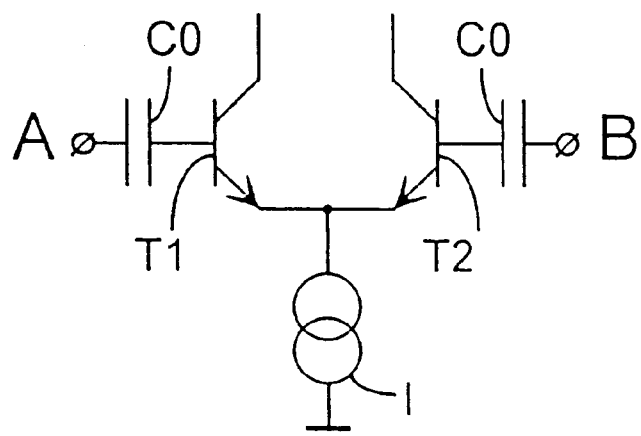
FIGS. 2a and 2b are, respectively, a partial electric circuit diagram of an amplifier provided with decoupling capacitors, and an AC-equivalent circuit diagram of said amplifier.
Figure 2B:
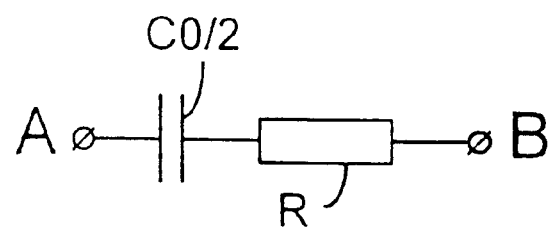

FIGS. 2a and 2b are, respectively, a partial electric circuit diagram of an amplifier provided with decoupling capacitors, and an equivalent circuit diagram, for small AC signals, of said amplifier. These diagrams will help to demonstrate the advantages of the structure shown in FIG. 1.

FIG. 2a shows an amplifier comprising a first transistor T1 and a second transistor T2 arranged as a differential pair, whose bases are connected to terminals A and B, respectively, via decoupling capacitors having a value C0. FIG. 2b is an equivalent circuit diagram, for small AC signals, of the amplifier described above, viewed from its two input terminals A and B. In a first approximation, this circuit is composed of two capacitors having a value C0 which are equivalent to a single capacitor having a value C0/2, in series with a resistor R which represents the equivalent input resistance of the differential pair T1, T2.

Figure 3A:
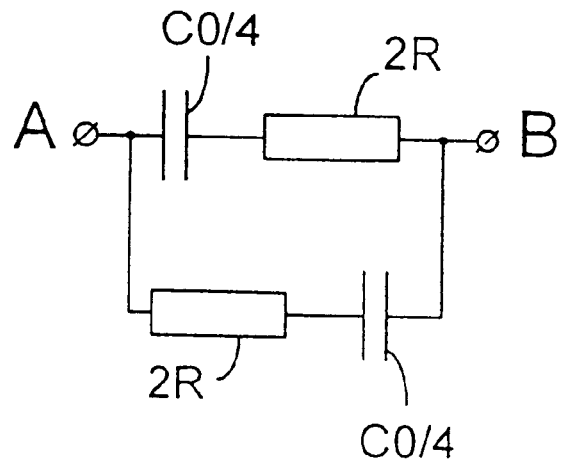
FIGS. 3a and 3b are, respectively, an AC-equivalent circuit diagram, equivalent to the previous circuit diagram, and a partial electric circuit diagram of a corresponding circuit.
Figure 3B:
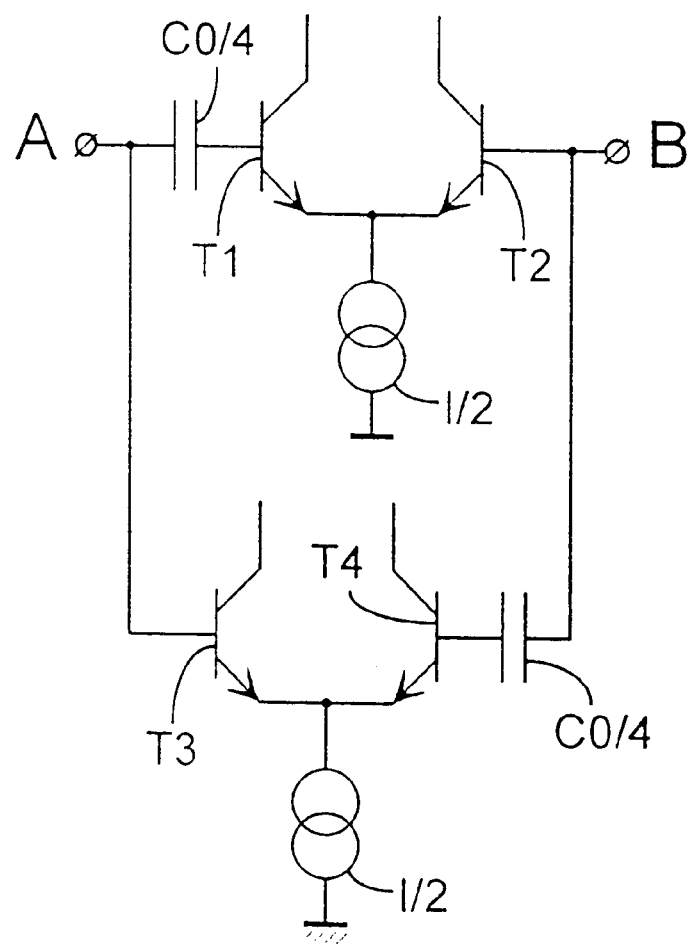

FIG. 3a is a diagram, for small AC signals, showing a circuit whose impedance, viewed from the input terminals A and B, is equivalent to that of the circuit shown in FIG. 2b. The circuit shown in FIG. 3a comprises two branches which are arranged in parallel between the terminals A and B, each composed of a capacitor and a resistor arranged in series. For the sake of equivalence with the previous diagram, the value of the capacitors must be C0/4 and that of the resistors must be 2R. FIG. 3b is an electric circuit diagram of a circuit whose impedance, viewed from its input terminals A and B, may be described by means of the previous diagram. This circuit comprises two branches arranged in parallel between the terminals A and B, each composed of a capacitor having a value C0/4 arranged in series with an amplifier. The amplifiers are similar to the one described above. The first amplifier is thus constituted by a first transistor T1 and a second transistor T2, arranged as a differential pair, while the second amplifier is constituted by a third transistor T3 and a fourth transistor T4, arranged as a differential pair. As each amplifier must have an equivalent input resistance of 2R, they are connected to a current source I/2 supplying a current which is twice as small as in the case of the amplifier shown in FIG. 2a. The capacitors of the value C0/4 ensure the decoupling of the DC component of the voltage between the terminals A and B. This structure is the one used in the reading system according to the invention, shown in FIG. 1. If the decoupling capacitors of the value C0 allow to obtain a low cut-off frequency FO of the order of megahertz values, for example, the same low cut-off frequency FO is obtained in the reading system according to the invention by means of decoupling capacitors having a value which is four times smaller. If CO is of the order of about a hundred picofarads, and thus difficult to realize in an integrated form, the first and second capacitors C shown in FIG. 1 should thus have a value of the order of several tens of picofarads, which may then be integrated.

Figure 4:
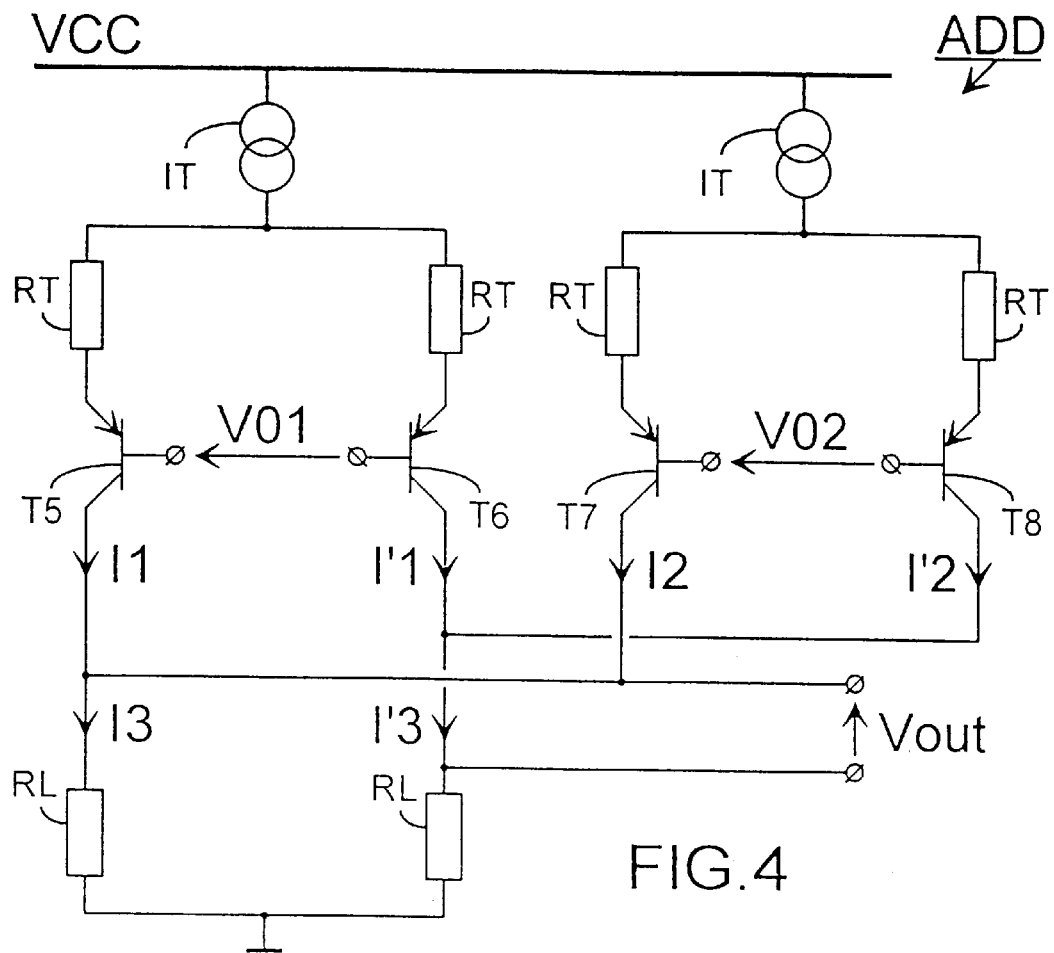
FIG. 4 is an electric circuit diagram illustrating an analog adder included in a particular embodiment of the invention.

FIG. 4 is an electric circuit diagram partially showing an analog adder ADD included in a particular embodiment of the invention. This adder comprises a first and a second transconductance module, each module being constituted by a pair of transistors T5, T6 and T7, T8 whose emitters are connected to a current source IT via resistors RT. The bases of the transistors constituting each of the transconductance modules, T5, T6 and T7, T8 constitute symmetrical inputs of the transconductance modules, receiving V01 and V02, respectively. The collectors of transistors T5, T6 and T7, T8 constitute symmetrical current outputs of the transconductance modules. The collector of the fifth transistor T5 supplies a current I1 which may be expressed as $K.(1+x).V01$ in which X is a multiplicative constant, and the value of x varies between 0 and 1 as a function of the voltage V01. The collector of the sixth transistor T6 supplies a current I'1 which may be expressed as $K.(1-x).V01$. The collector of the seventh transistor T7 supplies a current I2 which may be expressed as $K.(1+x).V02$, and the collector of the eighth transistor T8 supplies a current I'2 which may be expressed as $K.(1-x).V02$. The adder ADD also comprises a first and a second resistor RL each having a terminal connected to a fixed voltage terminal, here the circuit's ground. The first resistor RL is also connected to the collectors of the fifth and seventh transistors T5 and T7, while the second resistor RL is connected to the collectors of the sixth and eighth transistors T6 and T8, respectively. The first resistor RL is thus traversed by a current I3 which is equal to the sum of the currents I1 and I2, while the second resistor RL is traversed by a current I'3 which is equal to the sum of the currents I'1 and I'2. The difference between the voltages at the terminals of the first and second resistors RL constitutes the output signal Vout of the adder ADD. This may be expressed as $Vout=K'.(V01+V02)$, which indeed readily constitutes the output equation which was searched for.

Figure 5:
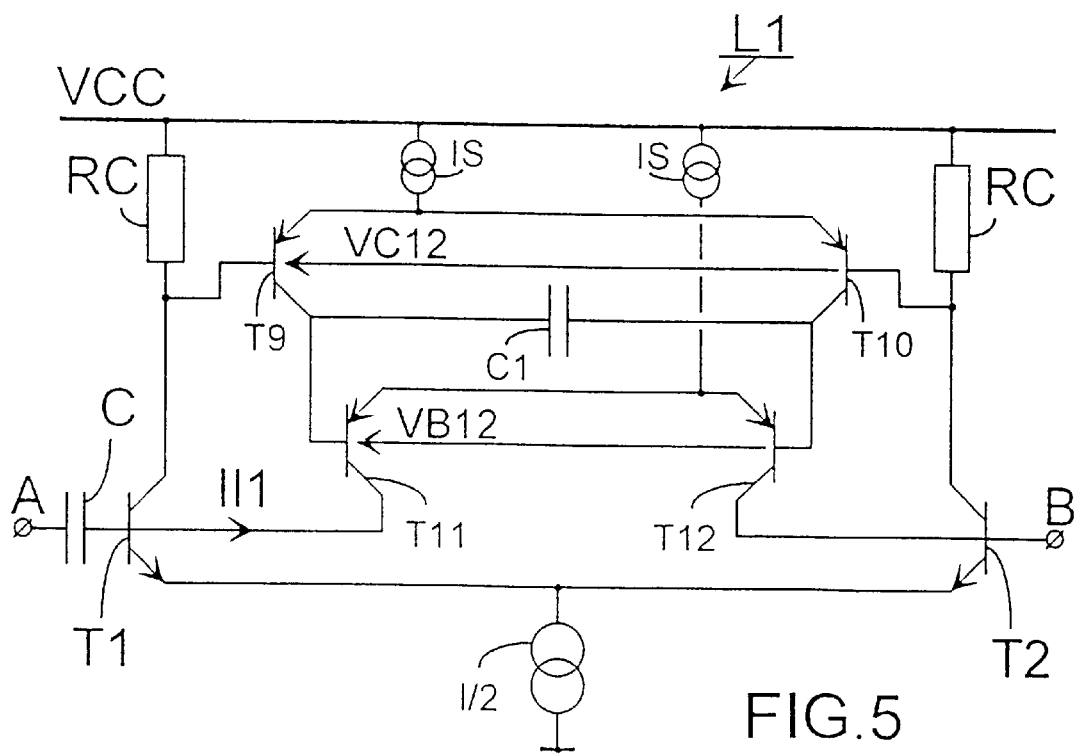
FIG. 5 is an electric circuit diagram illustrating an element having an inductive behavior, included in a preferred embodiment of the invention.

FIG. 5 is an electric circuit diagram showing an element having an inductive behavior L1 included in a preferred embodiment of the invention. This inductive element L1 comprises:

a pair of transistors T9, T10, referred to as primary pair, whose emitters are connected to a current source IS, whose bases are connected to the collectors of the transistors T1 and T2 of the first amplifier, and whose collectors are interconnected via a capacitor C1, and another pair of transistors T11, T12, whose emitters are connected to a current source IS, whose bases are connected to the collectors of the transistors of the primary pair T9, T10 and whose collectors are connected to the bases of the transistors T1 and T2.

If the transconductances of the transistors T1, T9 and T11 are defined as being equal to gm1, gm2 and gm3, respectively, the voltage VC12 is expressed as $-gm1RC.(VA-VB)$, while VB12 is expressed as $-gm2.VC12/(j.2.C.\omega)$, the current I11 being expressed as $gm3.VB12/2$. These three equations directly lead to the equation $(VA-VB)/I11=j.\omega.4.C/(gm1.gm2.gm3.RC)$, which defines the impedance of the element L1. This impedance can be expressed as $j.\omega.Leq$, which corresponds to an inductive behavior.

We claim:

1. A system for reading magnetic information, comprising:

a read head provided with a magnetoresistive bar whose electric resistivity varies when the read head is subjected to a magnetic field variation, said bar having a first and a second terminal and being intended to be traversed by a bias current of a predetermined value, a first amplifier comprising a first and a second transistor arranged as a differential pair, with their bases connected to the first and the second terminal, respectively, of the magnetoresistive bar and at least one collector constituting an output of the first amplifier, characterized in that the system also comprises:

a second amplifier comprising a third and a fourth transistor arranged as a differential pair, with their bases connected to the first and the second terminal, respectively, of the magnetoresistive bar and at least one collector constituting an output of the second amplifier, a first and a second capacitor having equal nominal values, the first capacitor being arranged between the base of the first transistor and the first terminal of the magnetoresistive bar, the second capacitor being arranged between the base of the fourth transistor and the second terminal of the magnetoresistive bar, and an analog adder having a first input connected to the output of the first amplifier, a second input connected to the output of the second amplifier and an output intended to supply a signal which is representative of the sum of the values of the signals received at the first and second inputs.

2. A system for reading magnetic information as claimed in claim 1, characterized in that the analog adder comprises:

a first and a second module of the transconductance type, each having an input constituting one of the inputs of the adder and an output intended to supply a current which is proportional to the value of a voltage received at its input, and a resistor having one terminal connected to a fixed voltage terminal and another terminal connected to the outputs of the first and second transconductance modules, the voltage at the terminals of said resistor constituting the output signal of the analog adder.

3. A system for reading magnetic information as claimed in claim 2, characterized in that each transconductance module is constituted by a pair of transistors whose emitters are connected to a current source via resistors, whose bases constitute a symmetrical input of the transconductance module, the collector of one of the transistors constituting the output of the transconductance module.

4. A system for reading magnetic information as claimed in claim 1, characterized in that each amplifier comprises an element having an inductive behavior and connected between the bases of the transistors in the amplifier, said inductive element comprising:

a pair of transistors, referred to as primary pair, whose emitters are connected to a current source, whose bases are connected to the collectors of the transistors of the amplifier, and whose collectors are interconnected via a capacitor, and another pair of transistors whose emitters are connected to a current source, whose bases are connected to the collectors of the transistors of the primary pair, and whose collectors are connected to the bases of the transistors of the amplifier.

5. A system for reading magnetic information as claimed in claim 2, characterized in that each amplifier comprises an element having an inductive behavior and connected between the bases of the transistors in the amplifier, said inductive element comprising:
- a pair of transistors, referred to as primary pair, whose emitters are connected to a current source, whose bases are connected to the collectors of the transistors of the amplifier, and whose collectors are interconnected via a capacitor, and
- another pair of transistors whose emitters are connected to a current source, whose bases are connected to the collectors of the transistors of the primary pair, and whose collectors are connected to the bases of the transistors of the amplifier.

6. A system for reading magnetic information as claimed in claim 3, characterized in that each amplifier comprises an element having an inductive behavior and connected between the bases of the transistors in the amplifier, said inductive element comprising:
- a pair of transistors, referred to as primary pair, whose emitters are connected to a current source, whose bases are connected to the collectors of the transistors of the amplifier, and whose collectors are interconnected via a capacitor, and
- another pair of transistors whose emitters are connected to a current source, whose bases are connected to the collectors of the transistors of the primary pair, and whose collectors are connected to the bases of the transistors of the amplifier.

* * * * *